United States Patent
Kim et al.

(10) Patent No.: US 7,471,109 B2
(45) Date of Patent: Dec. 30, 2008

(54) OUTPUT IMPEDANCE CIRCUIT AND OUTPUT BUFFER CIRCUIT INCLUDING THE SAME

(75) Inventors: Tae-Hyoung Kim, Seongnam-si (KR); Uk-Rae Cho, Suwon-si (KR)

(73) Assignee: Samsung Electronics Company, Ltd., Gyeonggi-Do (KR)

( * ) Notice: Subject to any disclaimer, the term of this patent is extended or adjusted under 35 U.S.C. 154(b) by 42 days.

(21) Appl. No.: 11/344,592

(22) Filed: Feb. 1, 2006

(65) Prior Publication Data

US 2006/0250156 A1    Nov. 9, 2006

(30) Foreign Application Priority Data

Feb. 1, 2005    (KR) .................. 10-2005-0009103

(51) Int. Cl.
  *H03K 17/16*    (2006.01)
(52) U.S. Cl. .......................... 326/83; 326/30
(58) Field of Classification Search .............. 326/30, 326/31, 33, 34, 82, 83, 86, 93, 95, 98, 108, 326/109
  See application file for complete search history.

(56) References Cited

U.S. PATENT DOCUMENTS

| | | | | |
|---|---|---|---|---|
| 4,339,677 A | * | 7/1982 | Hoeft | 327/308 |
| 5,241,221 A | * | 8/1993 | Fletcher et al. | 327/170 |
| 6,157,206 A | | 12/2000 | Taylor et al. | |
| 6,337,819 B1 | | 1/2002 | Shinozaki | |
| 6,486,700 B1 | * | 11/2002 | Fairbanks et al. | 326/36 |
| 2003/0179011 A1 | * | 9/2003 | Goodbread et al. | 326/39 |
| 2003/0206037 A1 | * | 11/2003 | Forbes | 326/98 |

FOREIGN PATENT DOCUMENTS

| | | |
|---|---|---|
| JP | 2000-183717 | 6/2000 |
| KR | 2001-11354 | 2/2001 |
| KR | 1020020042093 A | 6/2002 |

OTHER PUBLICATIONS

Office Action for corresponding Korean Application No. 10-2005-0009103 dated May 26, 2006 and English translation thereof.

* cited by examiner

*Primary Examiner*—James H. Cho
*Assistant Examiner*—Thienvu V Tran
(74) *Attorney, Agent, or Firm*—Harness, Dickey & Pierce, P.L.C.

(57) ABSTRACT

Provided is an output impedance circuit, which has a constant output impedance regardless of a pad voltage, and an output buffer circuit including the output impedance circuit. The output impedance circuit includes an output stage and an impedance control stage. The output stage outputs a current corresponding to a DC bias voltage via an output terminal, and the impedance control stage controls the current flowing through the output stage in response to an output signal. The output stage includes a resistance component and a first MOS transistor. A first terminal of the resistance component is connected to the output terminal. A first terminal of the first MOS transistor is connected to a second terminal of the resistance component, a second terminal of the first MOS transistor is connected to a voltage source, and an input signal is input to a gate of the first MOS transistor.

19 Claims, 3 Drawing Sheets

US 7,471,109 B2

OUTPUT IMPEDANCE CIRCUIT AND OUTPUT BUFFER CIRCUIT INCLUDING THE SAME

PRIORITY STATEMENT

This application claims the priority of Korean Patent Application No. 10-2005-0009103, filed on Feb. 1, 2005 in the Korean Intellectual Property Office, the entire contents of which are incorporated herein by reference.

FIELD OF THE INVENTION

The present invention relates to an output impedance circuit of a semiconductor device, and more particularly, to an output impedance circuit having an output impedance load with linear characteristics regardless of which system is connected to the output impedance circuit, and an output buffer circuit including the same.

DESCRIPTION OF THE RELATED ART

FIG. 1 is a diagram of a conventional output impedance circuit 100. As shown in FIG. 1, a conventional output impedance circuit 100 may include three P-type MOS transistors, first, second, and third P-type MOS transistors P1 through P3, and a resistor R. A fourth MOS transistor P4 may invert an input voltage Vg applied to its gate, the MOS transistor P4 may operate as an inverter which may use an output impedance circuit 100 as a load.

Structural characteristics of a conventional output impedance circuit 100 may be as follows.

Referring to FIG. 1, a first terminal of a first P-type MOS transistor P1 may be connected to a high voltage source Vcc, and a DC bias voltage Vb may be applied to a gate of the first P-type MOS transistor P1. A first terminal of a second P-type MOS transistor P2 may be connected to the high voltage source Vcc, and the DC bias voltage Vb may be applied to a gate of the second P-type MOS transistor P2. A first terminal of a third P-type MOS transistor P3 may be connected to a second terminal of the second P-type MOS transistor P2, and a second terminal of the third PMOS transistor P3 and a gate electrode of the third P-type MOS transistor P3 may be connected to a pad PAD. A first terminal of the resistor R may be connected to a second terminal of the first P-type MOS transistor P1 and a second terminal of the resistor R may be connected to the pad PAD.

An operation of the conventional output impedance circuit 100 illustrated in FIG. 1 is described assuming a voltage of a node connected the second terminal of the first P-type MOS transistor P1 and the second terminal of the resistor R is V1, and a voltage of a node connected to the other end of the second-type MOS transistor P2 and the first terminal of the third P-type MOS transistor P3 is V2.

Ohm's Law is expressed in Equation 1, including a voltage Vo between a high voltage source Vcc and a pad PAD, an impedance Zo, and a current Io flowing between the high voltage source Vcc and the pad PAD.

$$Zo = \frac{Vo}{Io} \quad (1)$$

Ideally, error does not result from an impedance difference of an output impedance circuit and a system regardless of which system is connected to the pad PAD if Zo does not change in spite of changes in Vo and Io. However, error may be caused by an impedance differences when using conventional output impedance circuit 100. The error may include, error caused by reflected signals that are not transmitted.

Initially, a resistance circuit including only a first P-type MOS transistor P1 and the resistor R will be described.

For example, if a pad PAD voltage is decreased in response to an input voltage Vg applied to a gate of a fourth MOS transistor P4, a voltage Vo between a high voltage source Vcc and the pad PAD increases. If an impedance Zo between the high voltage source Vcc and the pad PAD is constant, a current Io flowing through the high voltage source Vcc and the pad PAD will increase. The impedance Zo is a combination of an on resistance Zon of the resistor R and a resistance of the first P-type MOS transistor P1.

An on resistance Zon of a MOS transistor is expressed in Equation 2.

$$Zon = \frac{Vds}{Ids} \quad (2)$$

Vds indicates a voltage between a drain and a source of a MOS transistor, and Ids denotes a current flowing between the drain and the source of the MOS transistor.

Assuming that a voltage Vo increases while a current Io has not yet increased, a voltage across a resistor R remains constant, and a voltage V1 is lowered to substantially the same voltage as when a voltage of a pad PAD is lowered. In other words, a voltage Vb applied to a gate of the first P-type MOS transistor P1 does not change, and the voltage Vds between a drain and a source of the first P-type MOS transistor P1 should be increased to increase the current Ids between the drain and the source of the first P-type MOS transistor.

FIG. 2 is a graph illustrating voltage-current characteristic curves of a MOS transistor. FIG. 2, illustrates that when a voltage Vds between a drain and a source increases while the voltage (Vgs−Vt) between a gate and the source is constant, the curves are divided into a linear region in which a current Ids flowing between the drain and the source drastically increases and a saturation region in which the current Ids steadily increases. The dotted line in FIG. 2 distinguishes the two regions; curves on the left of the dotted line are in the linear region and curves on the right of the dotted line are in the saturation region.

A first P-type MOS transistor P1 may operate in a saturation region. Because current Ids between a drain and a source does not increase with substantially the same incremental speed as that of a voltage Vds between the drain and the source in the saturation region as described above, an on resistance Zon of the first P-type MOS transistor P1 increases and an insufficient amount of current may be supplied to a pad PAD. In other words, an impedance component (Zo1=R+Zon) seen from the pad PAD may increase.

To solve the above-described problem, serially connected second and third P-type MOS transistors P2 and P3 may be connected in parallel with a serially connected first P-type MOS transistor P1 and a resistor R. In this case, to complement an insufficient current needed to keep an impedance of a pad PAD constant, current from the two transistors P2 and P3 may be added to the pad PAD. In addition, an impedance component Zo2 of the second and third P-type MOS transistors P2 and P3 may be connected in parallel between an impedance component Zo1 of the first P-type MOS transistor P1 and the resistor R, and thus the impedance (Zo=Zo1//Zo2)

seen from the pad PAD decreases. Here, "//" indicates that Zo1 and Zo2 are connected in parallel.

However, sizes and resistances of second and third P-type MOS transistors P2 and P3 used to maintain a value of an impedance component of an output impedance circuit 100 connected to the pad PAD at a desired value may be susceptible to variations depending on a manufacturing process. Further, because second and third P-type MOS transistors P2 and P3 may operate in a saturation region, an amount of current may drastically increase according to the pad PAD voltage, and thus an impedance component may be excessively reduced in a low pad PAD voltage.

SUMMARY OF THE INVENTION

An example embodiment of the present invention provide an output impedance circuit that can function stably irrespective of changes in a manufacturing process and may have a desired output impedance regardless of a pad voltage.

An example embodiment of the present invention also provides an output buffer circuit that can function stably irrespective of changes in a manufacturing process and may have a desired output impedance regardless of a pad voltage.

An example embodiment of the present invention provides an output impedance circuit. The output impedance circuit may include an output stage and an impedance control stage. The output stage may supply a current to the output terminal corresponding to a DC bias voltage, and the impedance control stage may be configured to control the current flowing through the output stage in response to the output signal.

According to an example embodiment of the present invention, an output stage may include a resistance component and a first MOS transistor. A first terminal of the resistance component may be connected to the output terminal. A first terminal of the first MOS transistor may be connected to a second terminal of the resistance component; a second terminal of the first MOS transistor is connected to a voltage source, and a gate of the first MOS transistor may be supplied with a DC bias voltage.

The impedance control stage comprises a second MOS transistor, a first terminal of which is connected to a common node of the resistance component and the first MOS transistor, a second terminal of the second MOS transistor which is connected to the voltage source, and the output signal is applied to a gate of the second MOS transistor.

An example embodiment of the present invention provides an output buffer circuit. The output buffer circuit may include an impedance circuit with a regular impedance component at an output terminal through which an output signal is output, even if a voltage level of the output signal changes in response to an input signal. Further, the output buffer circuit may include a driving transistor and an output impedance circuit.

According to an example embodiment of the present invention, a first terminal of the driving transistor may be connected to the output terminal, a second terminal of the driving transistor may connected to a high voltage source, and a gate of the driving transistor may be supplied with the input signal.

According to an example embodiment of the present invention, a first terminal of the output impedance circuit may connected to a low voltage source, a second terminal of the output impedance circuit may be connected to an output terminal, and a third terminal of the output impedance circuit may receive a DC bias voltage.

An example embodiment of the present invention provides an output impedance circuit. The output impedance circuit may include an on/off selecting device configured to operate in response to a control signal and an inverse control signal, and to output an on/off signal for selecting an operation state of the output impedance circuit using the output signal; an output stage supplying a current corresponding to the inverse control signal to the output terminal; and an impedance control stage configured to control a current flowing through the output stage in response to the on/off signal.

BRIEF DESCRIPTION OF THE DRAWINGS

Example embodiments of the present invention will be more clearly understood from the detailed description taken in conjunction with the accompanying drawings.

DETAILED DESCRIPTION OF THE INVENTION

Figure 1:
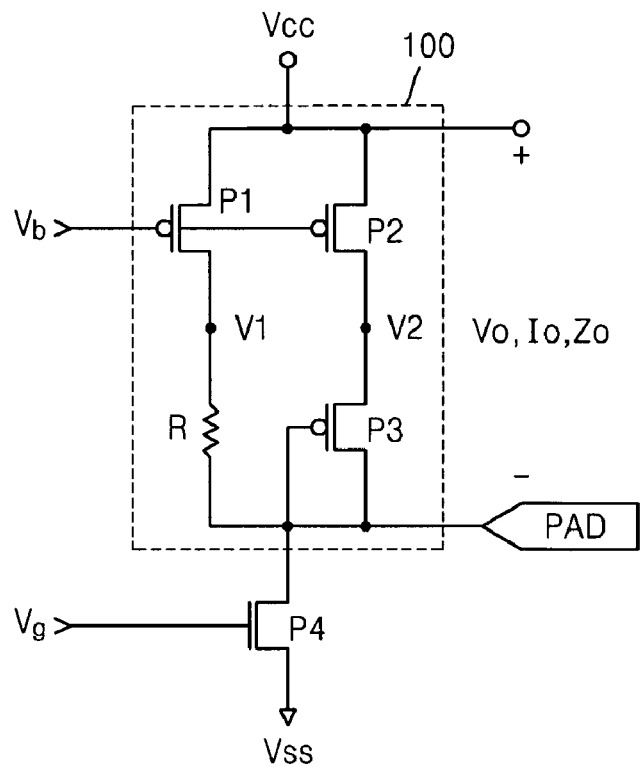
FIG. 1 is a circuit diagram of a conventional output impedance circuit.

Various example embodiments of the present invention will now be described more fully with reference to the accompanying drawings in which some example embodiments of the invention are shown.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 3:
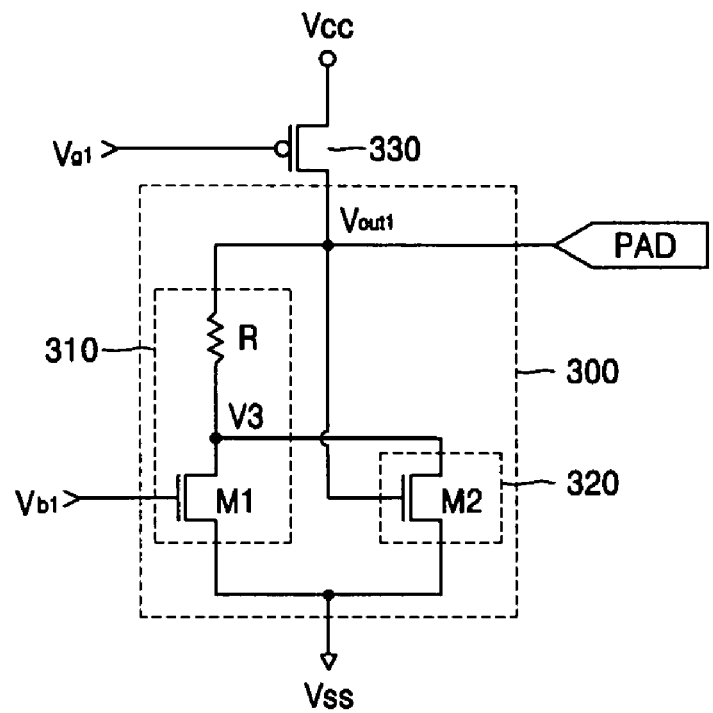
FIG. 3 is a circuit diagram of an output buffer circuit including an output impedance circuit according to an example embodiment of the present invention.

FIG. 3 is a circuit diagram of an output buffer circuit including an output impedance circuit 300 according to an example embodiment of the present invention. Referring to FIG. 3, an output buffer circuit may include a driving transistor 330 and an output impedance circuit 300.

A driving transistor 330 may respond to an input signal Vg1 and perform a function to determine an output voltage Vout1 of an output terminal PAD. To determine an output voltage Vout2, a driving transistor 330 may use a load of an output impedance circuit 300. A first terminal of a driving transistor 330 may be connected to a first voltage source Vcc; a second terminal of the driving transistor 330 may be connected to an output terminal PAD; and an input signal Vg1 may be input to a gate of the driving transistor 330.

An output impedance circuit 300 may include an output stage 310 and an impedance control stage 320. An output impedance circuit 300 may maintain a constant impedance component at an output terminal PAD even if a voltage level of an output signal Vout1 changes to correspond to a voltage level of an input signal Vg1.

An output stage 310 may include a resistor R and a first MOS transistor M1. A first terminal of the resistor R, or a resistance component, may be connected to an output terminal PAD. A first terminal of the first MOS transistor M1 may be connected to a common node V3 which may be connected to the resistor R; a second terminal of the first MOS transistor M1 may be connected to a second voltage source Vss; and a DC bias voltage Vb1 may be applied to a gate of the first MOS transistor M1. The DC bias voltage Vb1 may turn "on" the first MOS transistor M1, and may be connected to a first voltage source Vcc.

An impedance control stage 320 may include a second MOS transistor M2. A first terminal of the second MOS transistor M2 may be connected to the common node V3; a second terminal of the second MOS transistor M2 may be connected to a low voltage source Vss; and an output signal Vout1 may be applied to a gate of the second MOS transistor M2.

A first voltage source Vcc may supply a relatively high voltage among supply voltages used in an output buffer circuit including an output impedance circuit 300, and a second voltage source Vss may supply a relatively low voltage. First and second MOS transistors M1 and M2 may be N-type MOS transistors.

An output terminal PAD may be a pad of a semiconductor device, and a resistor R may be formed of poly-silicon, a phospho silicate glass (PSG), or a diffused active layer, for example.

An example operation of an output impedance circuit 300 according to an example embodiment of the present invention is described below.

For an output impedance circuit 300 to provide a stable impedance regardless of an output terminal PAD voltage, a voltage of a common node V3 needs to remain substantially constant regardless of a voltage of the output terminal PAD.

If a voltage of the output terminal PAD increases according to a voltage of the input signal Vg1, a voltage across both terminals of an output impedance circuit 300 decreases, thereby increasing the impedance seen from the output terminal PAD.

According to an example embodiment of the present invention, a second MOS transistor M2 may be used as an impedance control stage 320. For example, if a voltage of an output terminal PAD increases, a voltage applied to a gate of a second MOS transistor M2 increases, thereby increasing current flowing to the gate of the second MOS transistor M2. However, even if a gate voltage of the second MOS transistor M2 increases, a voltage of a common node V3 does not increase. Accordingly, an output impedance circuit 300 according to an example embodiment of the present invention differs from a conventional output impedance circuit 100 illustrated in FIG. 1 at least in the manner described above.

Figure 2:
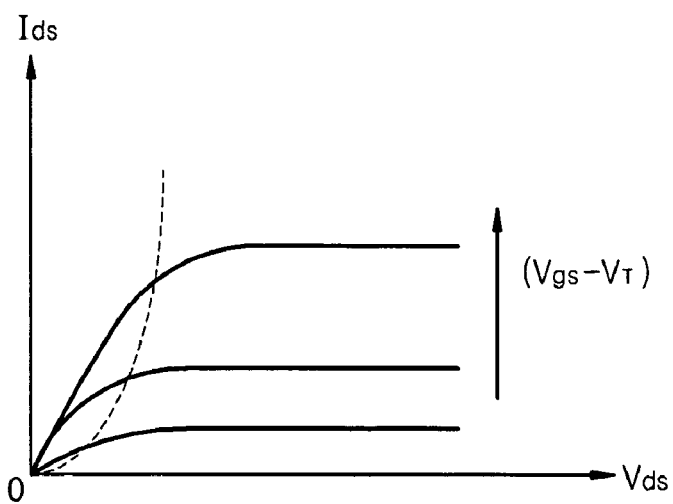
FIG. 2 is a graph illustrating voltage-current characteristic curves of a conventional MOS transistor.

Referring to the voltage-current characteristic curves of a MOS transistor illustrated in FIG. 2, if a voltage Vgs between a gate and a source of a MOS transistor is fixed, a voltage Vds between a drain and the source has to be increased in order to increase a current Ids between the drain and the source of the MOS transistor. However, if the voltage Vgs is increased, the voltage Vds between the drain and the source of the MOS transistor does not need to be increased. Accordingly, in an output impedance circuit 300 according to an example embodiment of the present invention, an output impedance hardly changes due to the second MOS transistor M2 for controlling impedance that may operate according to a voltage of a terminal PAD even if an amount of current that needs to be supplied to the output terminal PAD changes depending on changes of the voltage of the output terminal PAD.

By using a structure as described above, an impedance seen from an output terminal PAD may be maintained at a desired value.

Referring to FIG. 3, an operation of a first and second MOS transistors M1 and M2 may be divided into three main sections for explanatory purposes according to changes in a voltage of an output terminal PAD.

First, for example, if an output voltage Vout1 is smaller than a threshold voltage Vth of a MOS transistor, only a first MOS transistor M1 may operate in a linear region while a second MOS transistor M2 does not operate, and a current Ir1 flowing through a resistor R may be expressed as shown in Equation 3. Threshold voltages of both the first and second MOS transistors M1 and M2 may be expressed as Vth in Equation 3. For example, Vb1 may be connected to a first voltage source Vcc, and a second voltage source Vss may be 0 volts, which is ground voltage.

$$Ir1 = K1\{(Vcc - Vth)Vds1 - 1/2Vds1^2\} \qquad (3)$$
$$= K1\{(Vcc - Vth)aVout - 1/2a^2Vout1^2\}$$

Vds1 may be V3, and V3 is assumed to be aVout1, wherein "a" is a proportionality constant. Further, K1 (e.g., μCox W/L) may have a value determined by a process parameter, wherein μ is mobility of the carrier, Cox is Capacitance of a gate oxide, and W and L are width and length of a gate of a MOS transistor. Because Vcc>>Vout1, (Vcc−Vth) aVout1 is higher than ½a²Vout1², and thus a current Ir1 may be expressed in Equation 4.

$$Ir1 = K1*(Vcc-Vth)*aVout1 \qquad (4)$$

Second, for example, if a first MOS transistor M1 operates in a linear region and a second MOS transistor M2 operates in a saturation region, an output voltage Vout1 is higher than a threshold voltage Vth, and a current Ir2 having a lower voltage (Vth<Vout1<2Vth) than twice the threshold 2Vth may be expressed as shown in Equation 5.

$$Ir2 = K1\{(Vcc - Vth)Vds1 - 1/2Vds1^2\} + 1/2K2(Vout1 - Vth)^2 \quad (5)$$
$$= K1\{(Vcc - Vth)aVout1 - 1/2a^2Vout1^2\} +$$
$$1/2K2(Vout1 - Vth)^2$$
$$= Vout1\{aK1(Vcc - Vth) - K2Vth\} -$$
$$1/2Vout1^2(a^2K1 - K2) + 1/2K2Vth^2$$

If (a2K1-K2) equals 0, the current Ir2 may be expressed as shown in Equation 6. K2 may be a value determined by a process parameter.

$$Ir2 = Vout1\{aK1(Vcc-Vth)-K2Vth\}+\tfrac{1}{2}K2Vth^2 \quad (6)$$

Third, for example, a current Ir3, with an output voltage Vout1 having a higher voltage than twice a threshold voltage 2Vth (Vout1>2Vth), may be expressed as shown in Equation 7.

$$Ir3 = K1\{(Vcc - Vth)Vds1 - 1/2Vds1^2\} + K2\{(Vout1 - Vth)Vds2 - 1/2Vds2^2\} = \quad (7)$$
$$K1\{(Vcc - Vth)aVout1 - 1/2a^2Vout1^2\} + K2\{(Vout1 - Vth)aVout1 - 1/2a^2Vout1^2\} =$$
$$Vout1\{aK1(vcc - Vth) - K2Vth\} - Vout1^2(a^2K1/K2 - aK2 + 1/2a^2)$$

If K1 and K2 are appropriately controlled by adjusting sizes of first and second MOS transistors M1 and M2 when designing the first and second MOS transistors M1 and M2, the current Ir3 in Equation 7 may be expressed as shown in Equation 8.

$$Ir3 = Vout1\{aK1(Vcc-Vth)-K2Vth\} \quad (8)$$

According to an example embodiment of the present invention, if first and second MOS transistors M1 and M2 are designed with suitable values of K1 and K2 to satisfy Equations 4, 6, and 8, an output impedance circuit with an improved and/or ideal impedance may be produced.

Figure 4:
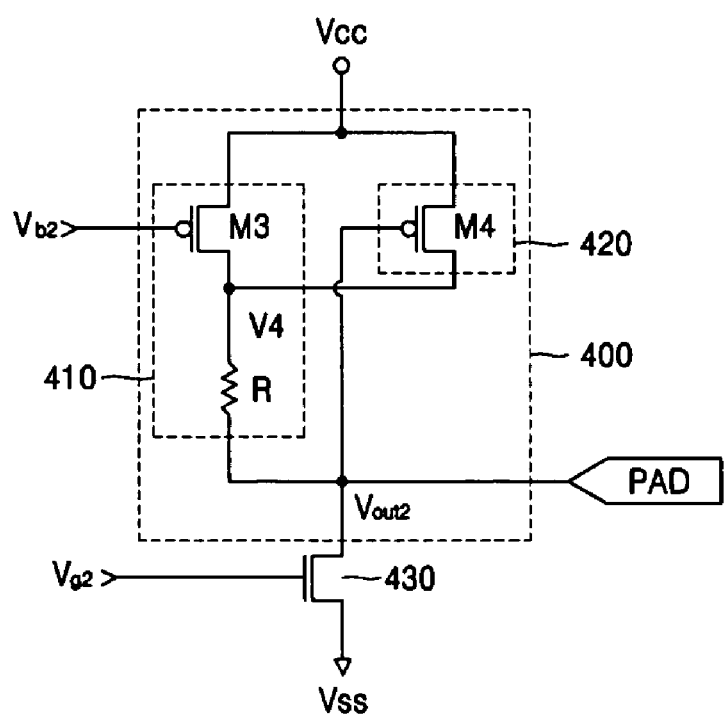
FIG. 4 is a circuit diagram of an output buffer circuit including an output impedance circuit according to an example embodiment of the present invention.

FIG. 4 is a circuit diagram of an output buffer circuit including an output impedance circuit 400 according to an example embodiment of the present invention. Referring to FIG. 4, an output buffer circuit may include a driving transistor 430 and an output impedance circuit 400.

A driving transistor 430 may respond to an input signal Vg2 and may function to determine an output voltage Vout2 of an output terminal PAD. To determine an output value Vout2 of an output terminal PAD, the driving transistor 430 may use a load of an output impedance circuit 400. According to an example embodiment of the present invention, a first terminal of the driving transistor 430 may be connected to a second voltage source Vss; a second terminal of the driving transistor 430 may be connected to the output terminal PAD; and an input signal Vg2 may be input to a gate of the driving transistor 430.

An output impedance circuit 400 may include an output stage 410 and an impedance control stage 420.

An output stage 410 may include a resistor R and a third MOS transistor M3. A first terminal of a resistor R, or a resistance component, may be connected to an output terminal PAD. A first terminal of the third MOS transistor M3 may be connected to a common node V4 of the resistor R; a second terminal of the third MOS transistor M3 may be connected to a first voltage source Vcc; and a DC bias voltage Vb2 may be applied to a gate of the third MOS transistor M3. The DC bias voltage Vb2 may turn "on" the third MOS transistor M3 and may use the low voltage source Vss.

An impedance control stage 420 may include a fourth MOS transistor M4. A first terminal of the fourth MOS transistor M4 may be connected to both the common terminal V4 and the first terminal of the third MOS transistor M3; a second terminal of the fourth MOS transistor M4 may be connected to the high voltage source Vcc; and an output voltage Vout2 may be applied to a gate of the fourth MOS transistor M4.

A first voltage source Vcc may supply a relatively high voltage compared to other supply voltages used in a system including an output buffer circuit according to an example embodiment of the present invention, and a second voltage source Vss may supply a relatively low voltage. Third and fourth MOS transistors M3 and M4 may be P-type MOS transistors.

An output terminal PAD may be a pad of a semiconductor device, and a resistor R may be formed using poly-silicon, a PSG, or a diffused active layer, for example.

An explanation of an operation of the output impedance circuit 400 according to an example embodiment of the present invention will be omitted herein, for the sake of brevity because the operation is substantially the same as the operation of the output impedance circuit 300 that was previously explained.

Figure 5:
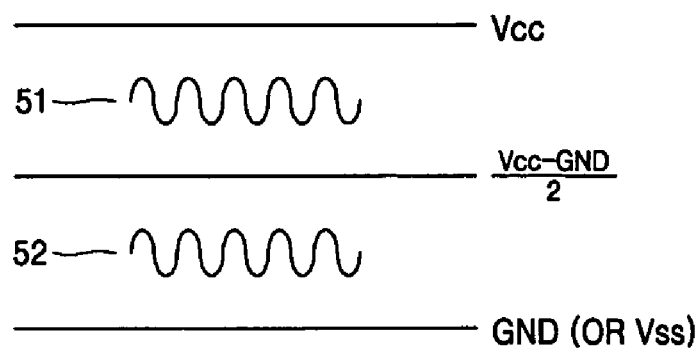
FIG. 5 illustrates a region in which output buffer circuits according to example embodiments of the present invention illustrated in FIGS. 3 and 4 may be effectively used.

FIG. 5 illustrates a region in which output buffer circuits 300 and 400 according to example embodiments of the present invention illustrated in FIGS. 3 and 4 may be effectively and/or optimally used.

According to an example embodiment of the present invention a shown in FIG. 5, it may be appropriate and/or beneficial to use an output buffer circuit 300 if a range of an output voltage of an output buffer circuit is as indicated by 51, and it may be appropriate and/or beneficial to use an output buffer circuit 400 if a range of an output voltage of an output buffer circuit is as indicated by 52.

Figure 6:
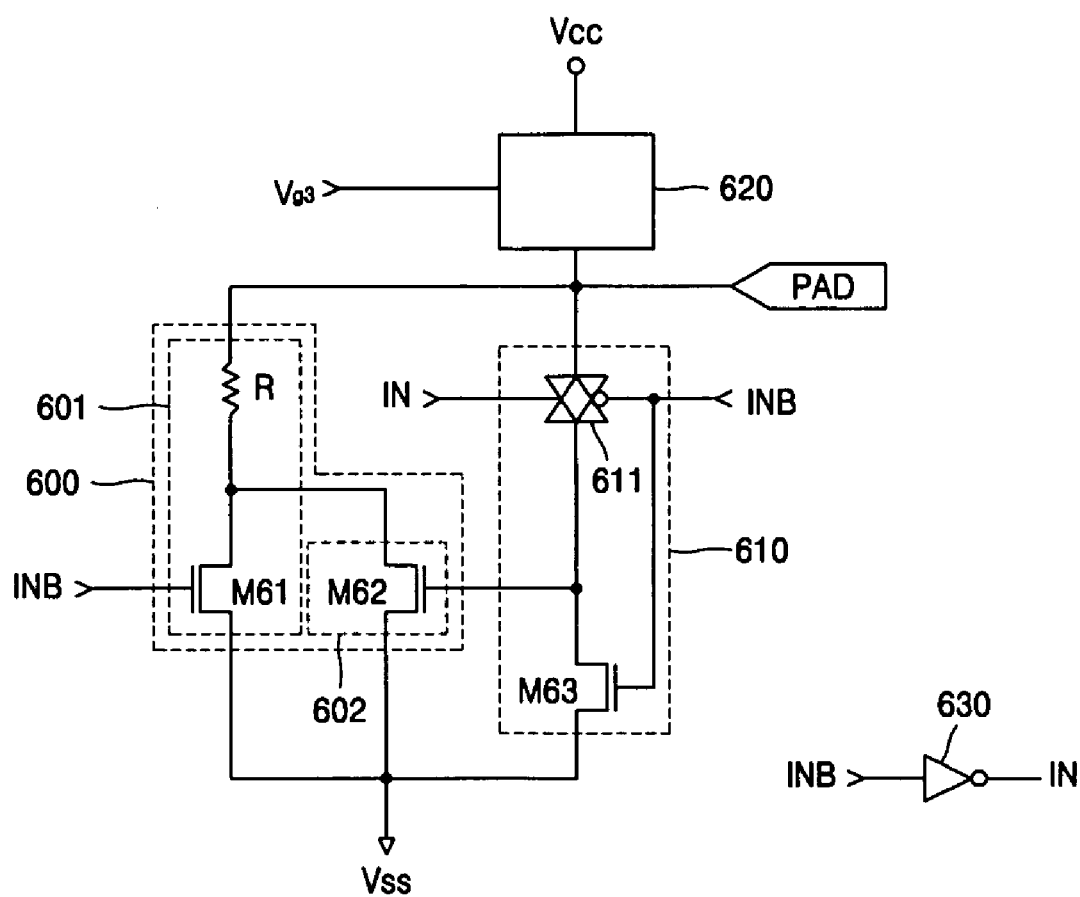
FIG. 6 is a circuit diagram of an output buffer circuit according to an example embodiment of the present invention.

FIG. 6 is a circuit diagram of an output buffer circuit according to an example embodiment of the present invention. Referring to FIG. 6, an output buffer circuit may include an output impedance circuit 600, an on/off selecting device 610, and a driving device 620.

A driving device 620 may function substantially the same as the driving transistors 330 and 430 described with respect to example embodiments of the present invention illustrated in FIGS. 3 and 4, and thus a detailed description of the driving device 620 is omitted herein for the sake of brevity.

An output impedance circuit 600 may include an output stage 601 and an impedance control stage 602. The output stage 601 and the impedance control stage 602 may be substantially the same as output stages 310 and 410 and the impedance control stages 320 and 420, respectively, as described with respect to example embodiments of the present invention illustrated in FIGS. 3 and 4, and thus detailed descriptions of the output stage 601 and the impedance control stage 602 are also omitted for the sake of brevity.

An on/off selecting device 610 may include a transmission gate 611 and a MOS transistor M63.

A transmission gate 611 may be operated by a control signal IN and/or an inverse control signal INB. For example, the inverse control signal INB may be input to a gate of the MOS transistor M63. Further, if an inverse control signal INB has a voltage high enough to turn "on" a MOS transistor M61 included in an impedance control stage 602 and the MOS transistor M63, the output impedance circuit 600 may operate normally as an impedance component. However, if an inverse control signal INB has a voltage lower than a threshold voltage of the MOS transistors M61 and M63, the output impedance circuit 600 may not operate normally and may instead operate as a high impedance component.

A control signal IN and an inverse control signal INB may be easily obtained using an inverter 630, for example.

As described above, an output impedance circuit according to an example embodiment of the present invention may function stably irrespective of changes in a manufacturing process and may have a relatively constant output impedance regardless of a pad voltage.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. An output impedance circuit comprising:
   an output stage supplying a current to an output terminal corresponding to a DC bias voltage, wherein the output stage includes
      a resistance component, a first terminal of the resistance component is connected to the output terminal; and
      a first MOS transistor, a first terminal of the first MOS transistor is connected to a second terminal of the resistance component, a second terminal of the first MOS transistor is connected to a first voltage source, and a gate of the first MOS transistor is supplied with the DC bias voltage; and
   an impedance control stage configured to control current flowing through the output stage in response to an output signal at the output terminal such that a constant impedance is maintained at the output terminal if a voltage level of the output signal changes, wherein the impedance control stage includes
   a second MOS transistor, a first terminal of the second MOS transistor is connected to a common node of the resistance component and the first MOS transistor, a second terminal of the second MOS transistor is connected to the first voltage source, and a gate of the second MOS transistor is supplied with the output signal.

2. The output impedance circuit of claim 1, wherein the first voltage source supplies a voltage lower than a plurality of voltages supplied by a plurality of voltage sources used in apparatus including the output impedance circuit.

3. The output impedance circuit of claim 2, wherein the first and second MOS transistors are N-type MOS transistors.

4. The output impedance circuit of claim 3, wherein the output terminal is a pad of a semiconductor device.

5. The output impedance circuit of claim 1, wherein the resistance component is a resistor formed of at least one of poly-silicon, phospho silicate glass (PSG), and a diffused active layer.

6. An output buffer circuit comprising:
   a driving transistor, a first terminal of the driving transistor is connected to the output terminal, a second terminal of the driving transistor is connected to a high voltage source, and a gate of the driving transistor is supplied with an input signal; and
   the output impedance circuit according to claim 1, a first terminal of the output impedance circuit is connected to a low voltage source, a second terminal of the output impedance circuit is connected to the output terminal, and a third terminal receives the DC bias voltage.

7. The output buffer circuit of claim 6, wherein the driving transistor is a P-type MOS transistor.

8. An output buffer circuit comprising:
   the output impedance circuit according to claim 1, a first terminal of the output impendence circuit is connected to a high voltage source, a second terminal of the output impedance circuit is connected to an output terminal, and a third terminal receives the DC bias voltage; and
   a driving transistor, a first terminal of which is connected to the output terminal, a second terminal of the driving transistor is connected to a low voltage source, and an input signal is input to a gate of the driving transistor.

9. The output buffer circuit of claim 8, wherein the driving transistor is a N-type MOS transistor.

10. An output impedance circuit comprising:
    an output stage supplying a current to an output terminal corresponding to a DC bias voltage, wherein the output stage includes
       a resistance component, a first terminal of which is connected to the output terminal; and
       a first MOS transistor, a first terminal of the first MOS transistor is connected to a common terminal of the resistance component and the first MOS transistor, a second terminal of the first MOS transistor is connected to a first voltage source, and a gate of the first MOS transistor is supplied the DC bias voltage; and
    an impedance control stage configured to control current flowing through the output stage in response to an output signal at the output terminal such that a constant impedance is maintained at the output terminal if a voltage level of the output signal changes, wherein the impedance control stage includes
    a second MOS transistor, a first terminal of the second MOS transistor is connected to the common terminal of the resistance component and the first MOS transistor, a second terminal of the second MOS transistor is connected to the first voltage source, and a gate of the second MOS transistor is supplied with the output signal.

11. The output impedance circuit of claim 10, wherein the first voltage source supplies a voltage higher than a plurality of voltages supplied by a plurality of voltage sources used in apparatus including the output impedance circuit.

12. The output impedance circuit of claim 11, wherein the first and second MOS transistors are P-type MOS transistors.

13. The output impedance circuit of claim 12, wherein the output terminal is a pad of a semiconductor device.

14. The output impedance circuit of claim 10, wherein the resistance component is a resistor formed of at least one of poly-silicon, PSG, and a diffused active layer.

15. An output impedance circuit comprising:
    an on/off selecting device configured to operate in response to a control signal and an inverse control signal, and to output an on/off signal for selecting an operation state of the output impedance circuit using an output signal at an output terminal;

an output stage supplying a current corresponding to the inverse control signal to the output terminal, wherein the output stage includes
  a resistance component, a first terminal of which is connected to the output terminal; and
  a first MOS transistor, a first terminal of which is connected to a second terminal of the resistance component, a second terminal of the first MOS transistor which is connected to a voltage source, and the inverse control signal is applied to a gate of the first MOS transistor; and
an impedance control stage configured to control a current flowing through the output stage in response to the on/off signal such that a constant impedance is maintained at the output terminal if a voltage level of the on/off signal changes, wherein the impedance control stage includes:
a second MOS transistor, a first terminal of the second MOS transistor is connected to a common node of the resistance component and the first MOS transistor, a second terminal of the second MOS transistor which is connected to the voltage source, and a gate of the second MOS transistor is supplied the on/off signal.

16. The output impedance circuit of claim 15, wherein the on/off selecting device includes:
  a switch configured to switch the output signal in response to the control signal and inverse control signal; and
  a third MOS transistor, a first terminal of the third MOS transistor is connected to a second terminal of the switch, a second terminal of the third MOS transistor is connected to the voltage source, and a gate of the third MOS transistor is supplied the inverse control signal.

17. The output impedance circuit of claim 16, wherein a first terminal of the switch is connected to the output terminal and a second terminal of the switch is connected to the first terminal of the third MOS transistor, operates according to the control signal and the inverse control signal, and is turned "on" when the control voltage is in a logic high voltage.

18. The output impedance circuit of claim 15, wherein phases of the control signal and the inverse control signal are opposite to each other.

19. The output impedance circuit of claim 15, further comprising an inverter which outputs the control signal by inverting the phase of the inverse control signal.

* * * * *